(12) United States Patent
Mauder et al.

(10) Patent No.: US 7,709,891 B2
(45) Date of Patent: May 4, 2010

(54) COMPONENT ARRANGEMENT INCLUDING A POWER SEMICONDUCTOR COMPONENT HAVING A DRIFT CONTROL ZONE

(75) Inventors: Anton Mauder, Kolbermoor (DE); Stefan Sedlmaier, Munich (DE); Franz Hirler, Isen (DE); Armin Willmeroth, Augsburg (DE); Gerhard Noebauer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/019,271

(22) Filed: Jan. 24, 2008

(65) Prior Publication Data

US 2008/0265320 A1 Oct. 30, 2008

(30) Foreign Application Priority Data

Jan. 26, 2007 (DE) .................... 10 2007 004 091

(51) Int. Cl.
*H01L 29/76* (2006.01)
(52) U.S. Cl. ............... 257/341; 257/401; 257/E21.418; 257/E29.257; 257/E29.26
(58) Field of Classification Search ............... 257/328, 257/329, 335, 336, 491, 492, 341, 401, E21.418, 257/E29.257, E29.26
See application file for complete search history.

(56) References Cited

U.S. PATENT DOCUMENTS

| 6,963,183 | B1 * | 11/2005 | Kessler et al. ............... 318/434 |
| 2003/0094649 | A1 * | 5/2003 | Hueting et al. .............. 257/328 |
| 2004/0043565 | A1 | 3/2004 | Yamaguchi et al. |
| 2007/0023830 | A1 * | 2/2007 | Pfirsch et al. ............... 257/341 |

FOREIGN PATENT DOCUMENTS

| DE | 10297349 T5 | 1/2005 |
| DE | 102005035153 A1 | 2/2007 |
| DE | 102005039331 A1 | 2/2007 |
| WO | 2007012490 A2 | 2/2007 |

OTHER PUBLICATIONS

The Office Action for German Patent Application No. 10 2007 004 091.3-33 mailed on Aug. 27, 2007.

* cited by examiner

*Primary Examiner*—Quoc D Hoang
(74) *Attorney, Agent, or Firm*—Dicke, Billig & Czaja, PLLC

(57) ABSTRACT

A component arrangement. One embodiment includes a power semiconductor component having a drift zone arranged between a first and a second component zone. A drift control zone is arranged adjacent to the drift zone and is dielectrically insulated from the drift zone by a dielectric layer. A capacitive storage arrangement is coupled to the drift control zone. A charging circuit is coupled between the first component zone and the capacitive storage arrangement.

22 Claims, 8 Drawing Sheets

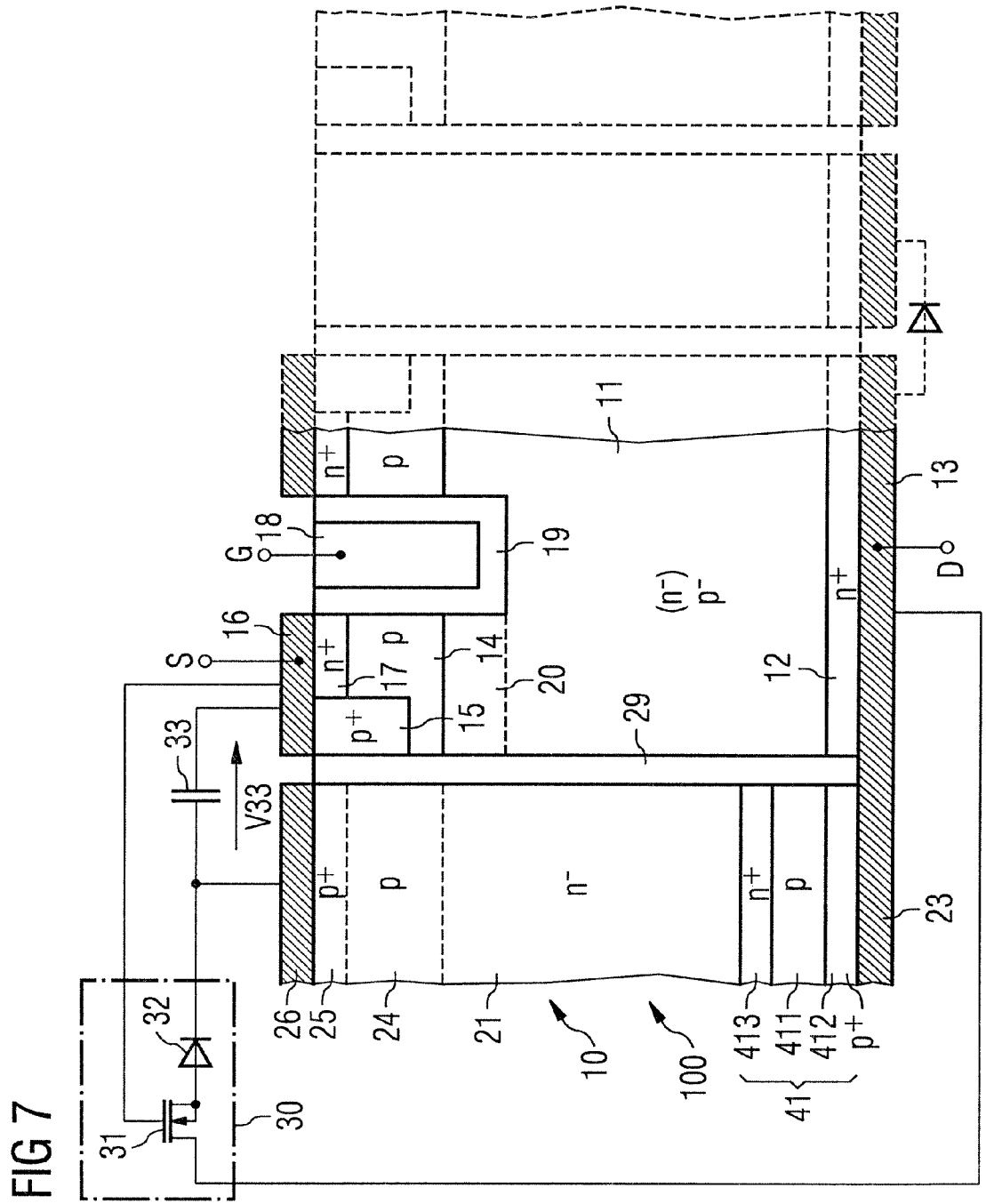

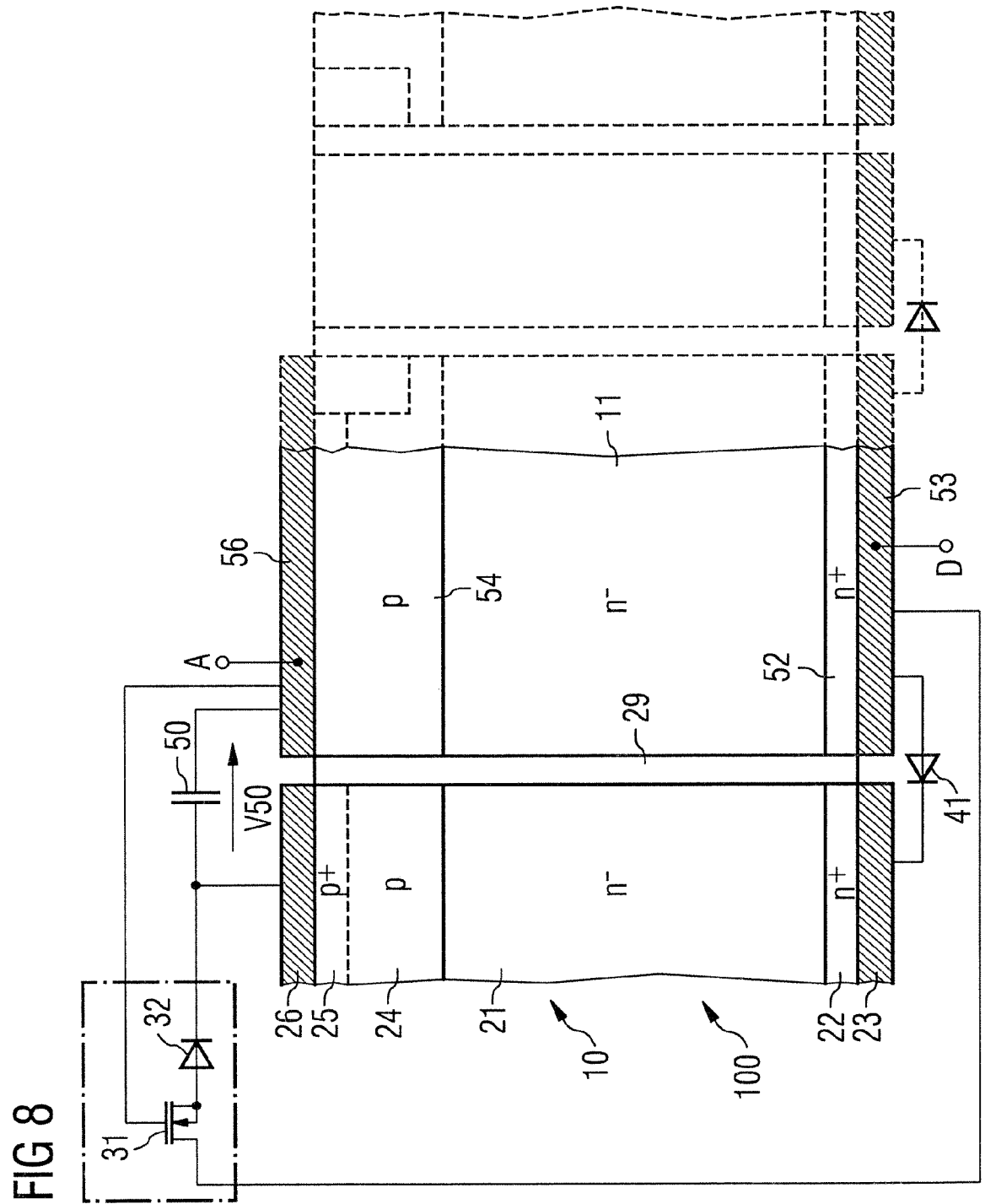

COMPONENT ARRANGEMENT INCLUDING A POWER SEMICONDUCTOR COMPONENT HAVING A DRIFT CONTROL ZONE

CROSS-REFERENCE TO RELATED APPLICATIONS

This Utility patent Application claims priority to German Patent Application No. DE 10 2007 004 091.3-33 filed on Jan. 26, 2007, which is incorporated herein by reference.

BACKGROUND

In a component arrangement including a power semiconductor component that has a drift zone and a drift control zone composed of a semiconductor material, with the drift control zone being is arranged adjacent to the drift zone, and being dielectrically insulated from the drift zone, the drift serves for controlling a conducting channel in the drift zone when the component is driven in the on state, i.e. is switched on.

The formation of a conducting channel in the drift zone requires charge carriers in the drift control zone, which, in the case of a component realized as a MOS transistor, can be supplied from a driving circuit or gate circuit of the transistor. However, this can lead to considerably higher gate currents than in MOS transistors without a drift control zone, such that conventional gate driver circuits whose current yield is designed for driving power semiconductor components without a drift control zone can no longer be used, under certain circumstances, in these novel power components. What is more, charge carriers can flow from the driving circuit into the drift control zone only when the MOS transistor is first driven in the on state, such that, at the beginning of driving the MOS transistor in the on state, there are not yet enough charge carriers available in the drift control zone to form a conducting channel in the drift zone. A low on resistance, which fundamentally distinguishes such components, is therefore achieved only after a time delay.

SUMMARY

A first aspect relates to a component arrangement that includes: a power semiconductor component having a drift zone, which is arranged between a first and a second component zone, and having a drift control zone composed of a semiconductor material, which is arranged adjacent to the drift zone and is dielectrically insulated from the drift zone by a dielectric layer; a capacitive storage arrangement, which is connected to the drift control zone; and a charging circuit, which is connected between the first component zone and the capacitive storage arrangement.

In this component arrangement, an electrical charge present in the drift control zone for controlling a conducting channel in the drift zone is buffer-stored in the capacitive storage arrangement and is provided during operation of the component by using the charging circuit from an electrical potential at the first component zone, which is part of the load path of the power semiconductor component. The electrical charge for the control of the conducting channel in the drift zone is thus obtained from a load circuit into which the load path of the power semiconductor component is connected during operation, and is available shortly after the application of a supply voltage to the power semiconductor component.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 7 illustrates one embodiment of a component arrangement that has a drift control zone which is modified as compared relative to the drift control zone in FIG. 1.

FIG. 8 illustrates one embodiment of a component arrangement having a power semiconductor component embodied as a power diode.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
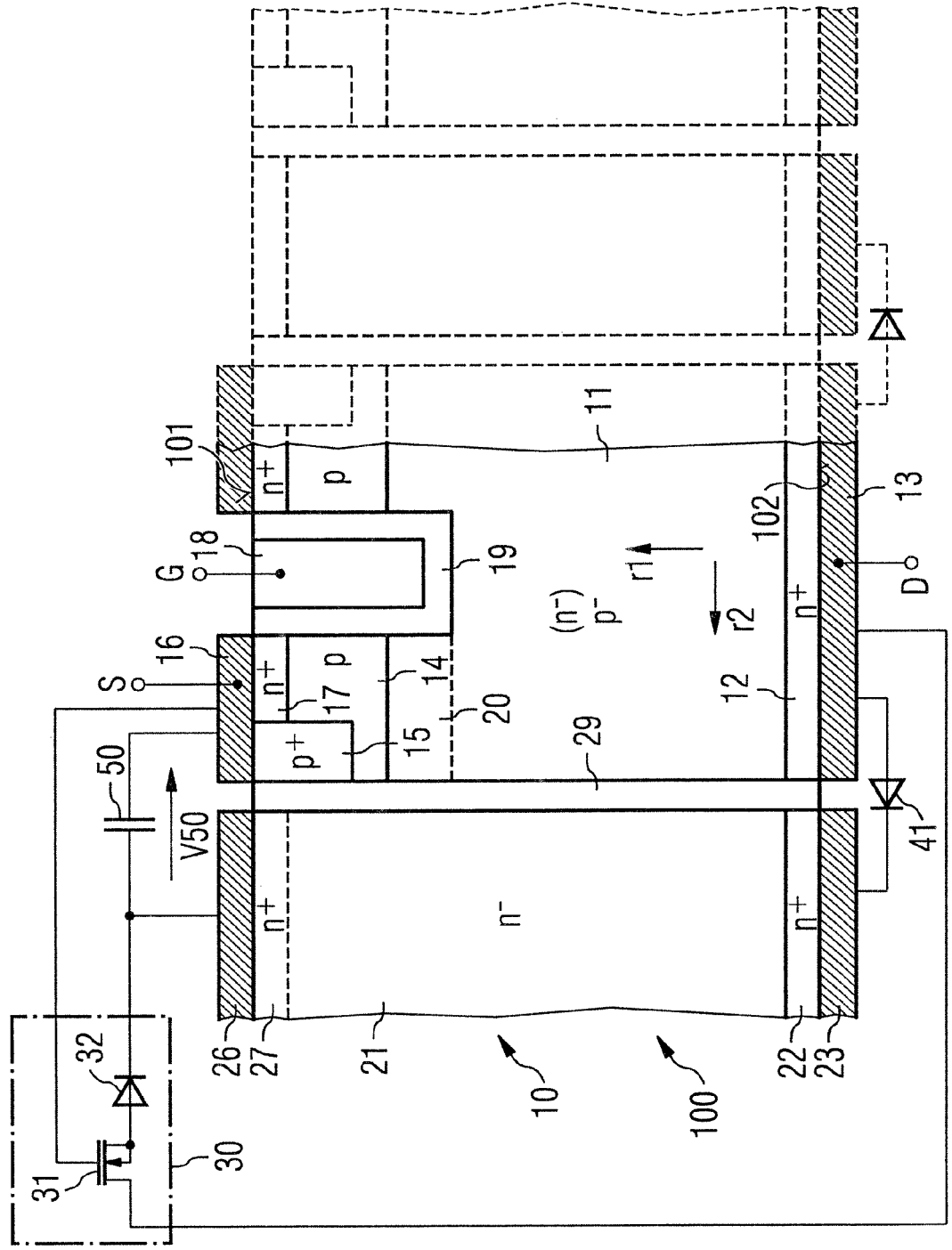
FIG. 1 illustrates one embodiment of a component arrangement having a power semiconductor component with a drift zone and a drift control zone, a capacitive charge storage arrangement and a charging circuit for the capacitive charge storage arrangement.

FIG. 1 illustrates one embodiment of a component arrangement having a power semiconductor component 10 with a drift zone 11 and a drift control zone 21 composed of a semiconductor material, a capacitive charge storage arrangement 50 connected to the drift control zone 21, and also a charging circuit for the capacitive storage arrangement 50. The power semiconductor component is illustrated schematically in FIG. 1 in a sectional diagram showing a cross section through a semiconductor body 100 in which semiconductor component regions of the power semiconductor component 10 are integrated. The capacitive storage arrangement 50 and the charging circuit 30 are illustrated on the basis of their electrical equivalent circuit diagrams in FIG. 1.

In the case of the power semiconductor component 10 illustrated in FIG. 1, the drift zone 11 is part of a MOS transistor structure and is arranged in a current flow direction r1 between a first component zone 12 and a second component zone 14 in the semiconductor body 100. In the case of the MOS transistor structure illustrated, the first component zone 12 is a drain zone, and the second component zone 14 is a body zone, adjacent to which is a source zone 17 in the current flow direction r1 at a side remote from the drift zone 11. A gate electrode 18 is present for controlling a conducting channel in the body zone 14 between the source zone 17 and the drift zone 11, said gate electrode being arranged adjacent to the body zone 14 and being dielectrically insulated from the body zone 14 by a gate dielectric 19.

Contact is made with the drain zone 12 by a drain electrode 13 and contact is made with the source zone 17 by a source electrode 16, which furthermore makes contact with the body zone 14 and thereby short-circuits the source zone 17 and the body zone 14. In the example illustrated, the source electrode 16 is connected to the body zone 14 via a connection zone 15 doped more highly than the body zone 14.

The transistor structure illustrated is a transistor structure of a normally off n-MOSFET. In this case, the source zone 17, the drift zone 11 and the drain zone 12 are n-doped and doped complementarily to the p-doped body zone 14. In the case of this component, the gate electrode 18 serves for controlling an inversion channel in the body zone 14 between the source zone 17 and the drift zone 11. The transistor structure illustrated is furthermore a vertical transistor structure; in this case, the drain zone 12, the drift zone 11, the body zone 14 and the source zone 17 are arranged adjacent to one another in a vertical direction of the semiconductor body 100. In the example illustrated, said vertical direction of the semiconductor body 100 corresponds to the current flow direction r1 in which, when the component is driven in the on state, a current flows through the drift zone 11 in a manner yet to be explained. The transistor structure illustrated is a trench transistor structure. In this case, the gate electrode 18 extends, proceeding from a first side 101 of the semiconductor body 100, which is referred to hereinafter as front side, in a vertical direction into the semiconductor body and extends—in each case in a manner insulated by the gate dielectric 19—from the source zone 17 via the body zone 14 right into the drift zone 11.

In a direction r2, which deviates from the current flow direction r1 and which runs perpendicular to the current flow direction r1 in FIG. 1 for explanation purposes, a drift control zone 21 composed of a semiconductor material, in one embodiment a monocrystalline semiconductor material, is arranged adjacent to the drift zone 11. Said drift control zone 21 is dielectrically insulated from the drift zone 11 by a drift control zone dielectric 29 and, in the example illustrated, has two connections or connection electrodes, namely a first connection electrode 23 and a second connection electrode 26, which make contact with the drift control zone 21 in the current flow direction r1 at respectively opposite ends. Connection zones 22, 27 doped more highly than the drift control zone 21 are optionally arranged between the connection electrodes 23, 26 and the drift control zone 21, and provide for a low-resistance contact between the connection electrodes 23, 26 and the drift control zone 21.

In the example illustrated, the drift control zone 21 is connected to the drain zone 12 via a rectifier element 41, for example a diode. Said rectifier element 41 is connected up in such a way that the electrical potential in the drift control zone 21 can rise above the value of an electrical potential of the drain zone 12, but that the electrical potential in the drift control zone 21 cannot fall below the electrical potential of the drain zone 12 or can fall below said electrical potential only by a defined value, the forward voltage of the diode 41 in the example.

The capacitive charge storage arrangement 50 is connected to the second connection 26 of the drift control zone 21 and, in the example, is realized as a capacitor 50 connected between said second connection zone 26 and the source zone 17 or the body zone 14 of the power semiconductor component or power transistor.

The charging circuit 30 for the capacitive charge storage arrangement 50 is connected between the drain zone 12 and a connection of the capacitive charge storage arrangement 50 which faces the drift control zone 21. In the example illustrated, said charging circuit 30 includes a normally on transistor 31 having a load path and a control connection, and also a rectifier element 32, for example a diode. A series circuit including the load path of the normally on transistor 31 and the diode 32 is in this case connected between the drain zone 12 and the capacitive charge storage arrangement 50. The normally on transistor 31 is driven depending on an electrical voltage V50 across the capacitor of the capacitive charge storage arrangement 50. In the example illustrated, the control connection of the normally on transistor 31 is connected for this purpose to that connection of the capacitor which is remote from the drift control zone 21 or to the source and body zones 17, 14.

In the case of the power semiconductor component 10 illustrated, the drift control zone 21 serves, in a manner yet to be explained, for controlling a conducting channel in the drift zone 11 along the drift control zone dielectric 29. In this case, said drift control zone 21 brings about a reduction of the on resistance of the power semiconductor component 10 in comparison with power semiconductor components 10 which have a drift zone having the same doping but no drift control zone. In one embodiment, the drift control zone 21 makes it possible to reduce the doping concentration of the drift zone 11 and thus to increase the dielectric strength of the MOS transistor structure for the same on resistance.

The power semiconductor component 10 can be constructed in cellular fashion, that is to say can have a multiplicity of identically constructed and parallel-connected transistor structures each having a drift control zone arranged adjacent to the drift zone of a transistor structure. Such a construction having a multiplicity of structures of identical type is indicated by dashed lines in FIG. 1. The cells can be realized as strip cells, and the component structures illustrated in FIG. 1 are then formed in elongated fashion in a direction perpendicular to the plane of the drawing illustrated.

The cells can furthermore also be realized as polygonal, for example square or hexagonal, cells. In this case, the drift zones have a polygonal cross section and are surrounded by the drift control zone in the plane running perpendicular to the plane of the drawing illustrated.

Figure 2:
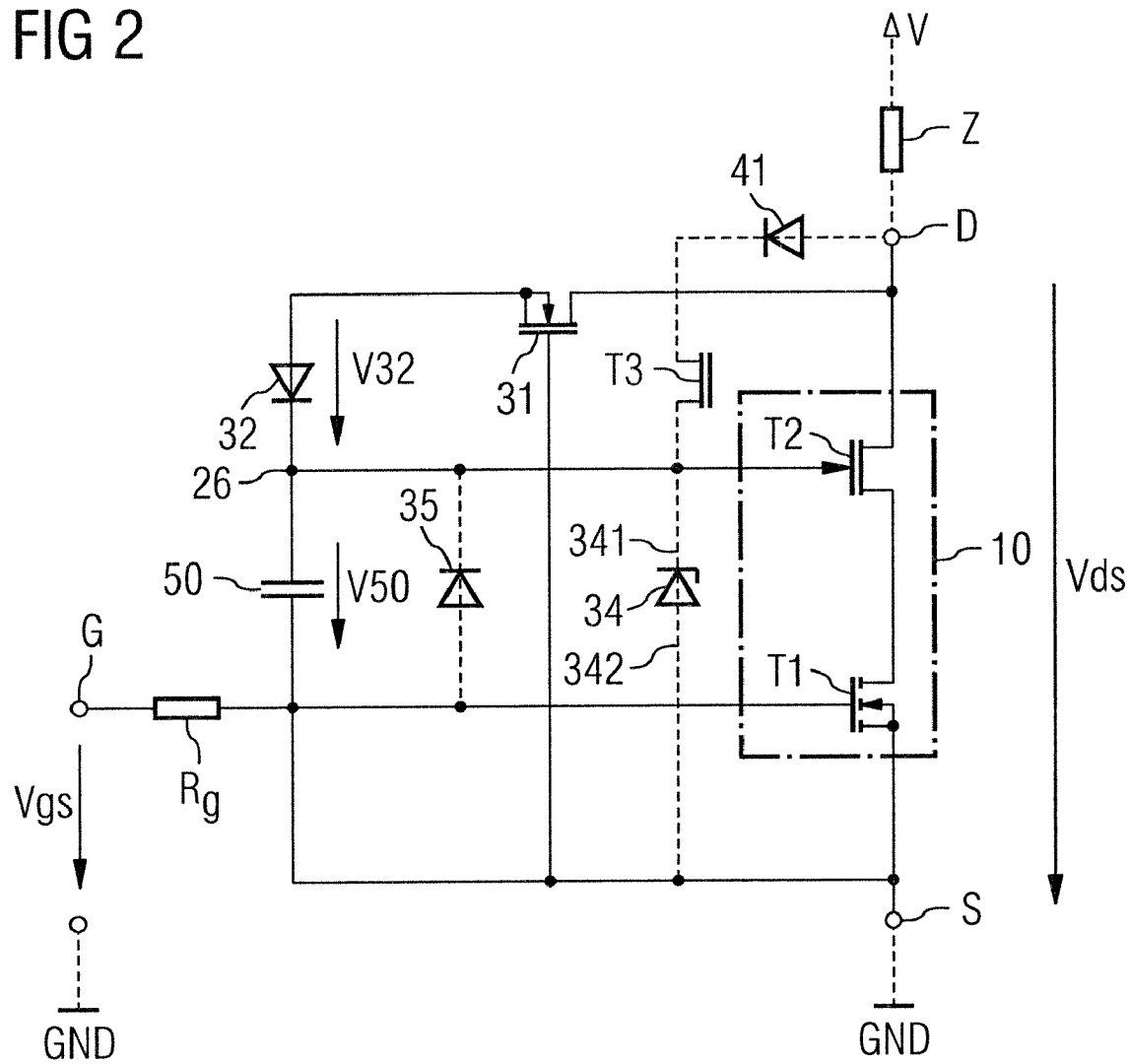
FIG. 2 illustrates an electrical equivalent circuit diagram of the component arrangement in accordance with FIG. 1.

An electrical equivalent circuit diagram of the component arrangement illustrated in FIG. 1 with the power semiconductor component 10, the capacitive charge storage arrangement 50 and also the charging circuit 30 is illustrated in FIG. 2. The power semiconductor component 10 with the MOS transistor structure and the drift control zone arranged adjacent to the drift zone 11 is illustrated as a series circuit formed by a normally off MOSFET T1 and a normally on MOSFET T2 from FIG. 2. In this case, the normally off MOSFET T1 represents the transistor structure with the source zone 17, the body zone 14 and the gate electrode 18. The reference symbol Rg in FIG. 2 designates a gate resistance of the normally off transistor, which takes account of line resistances that are unavoidably present. The normally on MOSFET T2 represents the drift zone 11, the conductivity behavior of which is controlled by the drift control zone 21. In this case, a control connection of the JFET corresponds to the second connection 26 of the drift control zone 21. In this circuit diagram, the drift control zone is represented by a further normally on MOSFET, the load path of which is connected to the drain zone of the power transistor via the diode 14.

The equivalent circuit diagram in FIG. 2 contains two further optional components 34, 35, the functioning of which will be explained further below.

Figure 3:
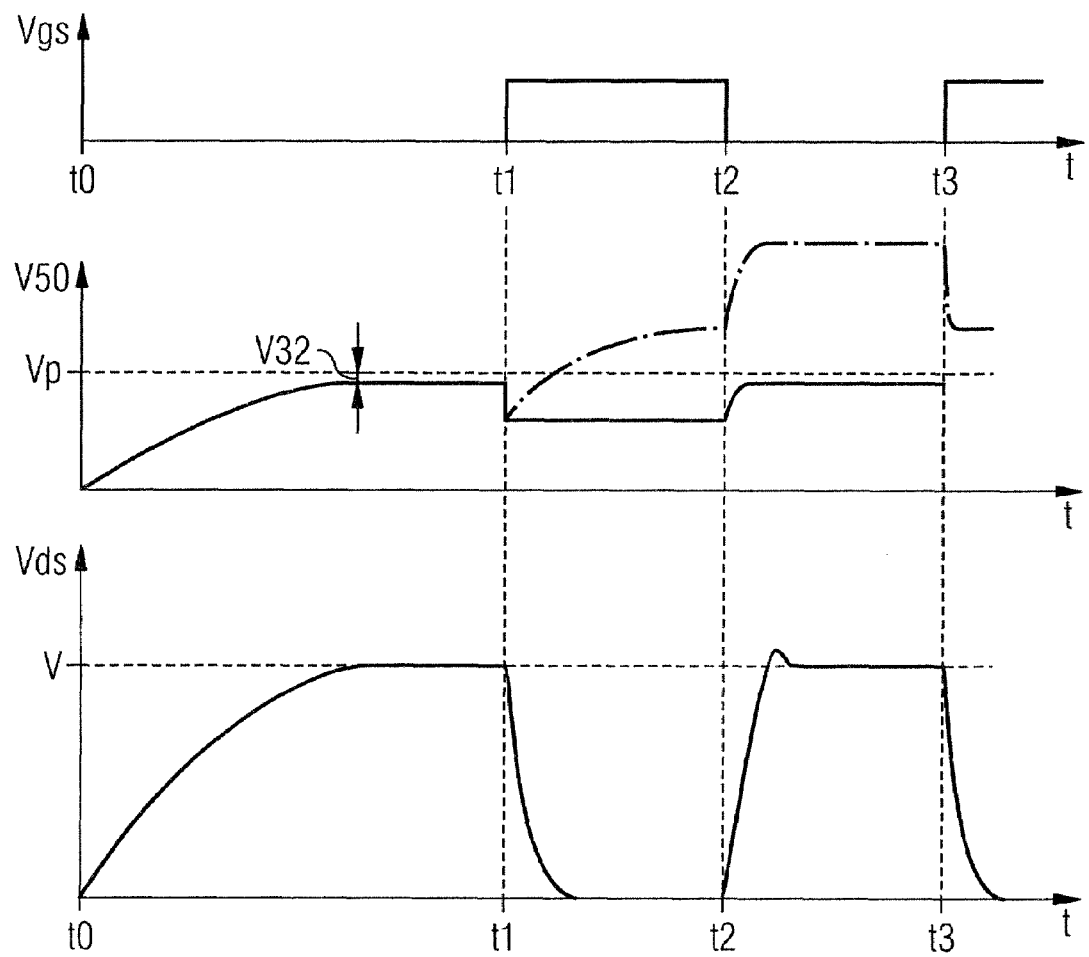
FIG. 3 illustrates the functioning of the component arrangement in FIGS. 1 and 2 on the basis of temporal signal and voltage profiles.

The functioning of one exemplary embodiment of the component arrangement that has been explained above is explained below with reference to FIGS. 1 and 2 and also with reference to FIG. 3. FIG. 3 illustrates temporal profiles of a driving voltage or a gate-source voltage Vgs of the MOS transistor structure, a voltage V50 across the capacitive charge storage arrangement 50, and also a load path voltage or drain-source voltage of the MOS transistor structure. For explanation purposes it is assumed here that the load path or drain-source path of the MOS transistor structure is connected in series with a load Z between terminals for a first supply potential or positive supply potential V and a second supply potential, or negative supply potential or reference potential GND.

The temporal illustration in FIG. 3 begins at an instant t0. For explanation purposes it shall be assumed that, at said instant t0, supply potentials V, GND are applied to the supply potential terminals, or that a supply voltage is applied between said supply potential terminals, the first supply potential rising with finite slope steepness, as illustrated, at the instant t0. Upon application of this supply voltage, a current flows via the normally on transistor 31 and the diode 32 to the storage capacitor 50, which are connected in series with one another and in parallel with the load path D-S of the power semiconductor component 10. In this case, the voltage across the storage capacitor 50 rises until a driving voltage V31 of the normally on transistor 31 reaches the value of the pinch-off voltage of the normally on transistor 31. The normally on transistor 31 illustrated is an n-conducting transistor which pinches off at a negative driving voltage or gate-source voltage V31. In this case, a source connection of said normally on transistor 31 is connected via the diode 32 to that connection of the storage capacitor 50 which faces the drift control zone, and the control connection or gate connection of the normally on transistor 31 is connected to that connection of the storage capacitor 50 which is remote from the drift control zone. The transistor 31 is in the off state if the sum of the forward voltage V32 of the diode 32 and the voltage V50 present across the storage capacitor 50 reaches the value of the pinch-off voltage in terms of its magnitude. A voltage V50 corresponding to said pinch-off voltage—which is designated by Vp in FIG. 3—minus the forward voltage V32 of the diode 32 is then established across the storage capacitor 50. Due to the charging operation of the storage capacitor 50, the load path voltage Vds of the power semiconductor component 10 initially driven in the off state rises not directly but in accordance with the charging curve of the storage capacitor 50 to the value of the supply voltage V, which is likewise illustrated in FIG. 3. In this case, the charging current of the storage capacitor 50 is essentially limited by the on resistance of the normally on transistor 31.

At an instant t1, the power semiconductor component 10 is driven in the on state. For this purpose, a suitable electrical potential or a suitable gate-source voltage Vgs, by virtue of which an inversion channel forms in the body zone 14 along the gate dielectric 19, is applied to the gate electrode 18. Said inversion channel enables an electron flow from the source zone 17 via the inversion channel in the body zone 14 and the drift zone 11 to the drain zone 12, whereby the electrical resistance of the load path decreases and the drain-source voltage Vds present thus decreases. At the same time, with incipient driving of the MOS transistor structure, charge carriers previously stored in the storage capacitor 50 flow into the drift control zone 21 and charge the drift control zone 21 positively with respect to the drift zone 11.

In this case, the diode 41 between the drift control zone 21 and the drain zone 12 prevents the positive charge carriers from flowing away from the drift control zone 21 in the direction of the drain connection D. In this case, the dielectric strength of said diode 41 limits the voltage by which the electrical potential of the drift control zone 21 can lie above the electrical potential of the drain zone 12 or of the drift zone 11 when the component is driven in the on state. Said dielectric strength can be chosen such that it is greater than the voltage to which the storage capacitor 50 is maximally charged during operation of the component. The diode 41 then fundamentally prevents positive charge from being able to flow away from the drift control zone 21 in the direction of the drain connection D. The diode connected in series with the load path of the normally on transistor 31 is connected up in such a way that it prevents charge carriers from flowing away from the storage capacitor 50 to drain potential D via the normally on transistor 31.

The positive charge present in the drift control zone 21 when the power semiconductor component 10 is driven in the on state brings about the formation of an accumulation channel in the drift zone 11 along the drift control zone dielectric 29. Said accumulation channel leads, in the manner already explained, to a reduction of the on resistance of the power semiconductor component or, for the same on resistance, enables a lower doping of the drift control zone and thus an increase in the dielectric strength.

A decrease—illustrated in FIG. 3—in the voltage V50 across the storage capacitor when the power semiconductor component is switched on results from electrical charge flowing away from the storage capacitor 50 into the drift control zone 21 or to a drift control zone capacitance formed by the drift control zone 21, the drift control zone dielectric 29 and the drift zone 11.

In the case of the component arrangement, the electrical charge required for forming the accumulation channel in the drift control zone 21 is already available shortly after application of a supply voltage, and thus usually significantly before the power semiconductor component 10 is first driven in the on state. In the case of this component arrangement, the electrical potential by which the drift control zone 21 lies above the electrical potential of the drift zone 11 can be set by the pinch-off voltage of the normally on transistor 31 of the charging circuit 30. This electrical potential can be set, in one embodiment, in such a way that it lies above the gate potential when the power semiconductor component is driven in the on state. Since, in the case of the component arrangement, by using the pinch-off voltage of the normally on transistor 31, it is possible to set a very high capacitor voltage V50 and thus a high potential difference between the electrical potential of the drift control zone 21 and the drift zone 11 with the component in the on state, this results, on the one hand, in a pronounced accumulation effect and thus in an effective reduction of the on resistance. On the other hand, as the potential difference rises, it is possible to use a thicker drift control zone dielectric 29 for the same accumulation effect. Such a thicker drift control zone dielectric can be produced more simply and is more robust than a thin dielectric.

If the component is driven in the off state, which is illustrated by a falling edge of the driving voltage Vgs at the instant t2 in FIG. 3, then the inversion channel in the body zone 14 is interrupted and, proceeding from a pn junction between the body zone 14 and the drift zone 11 doped complementarily thereto, a space charge zone propagates in the direction of the drain zone 12 in the drift zone 11. The space charge zone propagates further in the direction of the drain zone 12 as the load path voltage Vds increases.

When the component is driven in the off state, the drain potential rises in comparison with the source potential. The electrical potential in the drift control zone 21 correspondingly rises relative to the source potential, due to the diode 41. The positive charge carriers that flowed from the storage capacitor 50 into the drift control zone 21 when the component was driven in the on state are thereby shifted back into the storage capacitor 50. As a result of this, a voltage V50 across the storage capacitor 50 rises to the original voltage value before the power semiconductor component was switched on. If the drain potential rises further after the voltage V50 across the storage capacitor 50 has reached its original value, then a space charge zone starts to form in the drift control zone 21 between the two connection zones 22, 27, within which space charge zone the electrical potential increases in the drift control zone 21 in the vertical direction of the semiconductor body 100 in the direction of the front side 101. In this case, the drift control zone 21 is doped lightly enough that such a space charge zone can propagate. The propagation of such a space charge zone is supported by virtue of the fact that the body zone 14 at source potential and its connection zone are coupled to the drift control zone via the drift control zone dielectric 29. In this case, the upper region of the drift control zone acts in conjunction with the body zone 14, 15 as a normally on transistor that turns off as the potential rises in the drift control zone 21.

When the MOS transistor structure is driven in the off state, the electrical potential in the drift zone 11 rises proceeding from the drain zone 12 in the direction of the pn junction. A corresponding voltage rise in the drift control zone 21 due to a space charge zone propagating in the drift control zone 21 reduces the voltage drop across the drift control zone dielectric 29 in comparison with a theoretical case in which the entire drift control zone 21 is at drain potential. The greater the thickness with which the drift control zone dielectric 29 is realized, then the higher the dielectric strength of said dielectric is, the greater said voltage drop is allowed to be and the greater the extent to which the voltage profile in the drift zone 11 can deviate from the voltage profile in the drift control zone 21 without the drift control zone dielectric 29 being destroyed.

The voltage profile in the drift control zone 21 is determined in one embodiment by the doping concentration in the drift control zone 21, which can correspond to the doping concentration of the drift zone 11 and which can be in the region of approximately $10^{14}$ cm$^{-3}$ for components having reverse voltages of up to approximately 600 V. The doping concentration can be reduced by half for higher reverse voltages of up to 2000 V. In order to avoid damage to the component, the doping concentration of the drift control zone 21 should be coordinated with the doping conditions in the drift zone 11, the dielectric strength of the drift control zone dielectric 29 and the desired dielectric strength of the component in such a way that at a maximum permissible reverse voltage (that is to say load path voltage when the component is driven in the off state) no avalanche breakdown occurs in the drift control zone 21, and that a space charge zone propagates in the drift control zone 21 in the current flow direction to an extent such that the electric field formed from the field strength components in the current flow direction and perpendicular to the current flow direction does not exceed the breakdown field strength of the semiconductor material used for the drift control zone 21. The doping conditions in the drift control zone 21 can be chosen in such a way that the drift control zone 21 can be fully depleted in a direction perpendicular to the current flow direction or perpendicular to the drift control zone dielectric 29.

Figure 4:
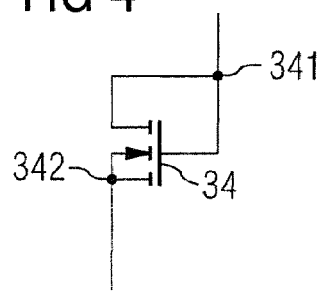
FIG. 4 illustrates an alternative for one of the components illustrated in the equivalent circuit diagram in FIG. 2.

Referring to FIG. 2, a voltage limiting element 34, for example a reverse-biased zener diode, can optionally be connected in parallel with the storage capacitor 50, and upwardly limits the voltage V50 across the storage capacitor 50. Referring to FIG. 4, said voltage limiting element can be realized in one embodiment as a MOSFET connected up as a diode. In this case, a threshold voltage of said MOSFET (that is to say a minimum gate-source voltage required for driving in the on state) determines the maximum voltage V50 present across the storage capacitor 50. Said threshold voltage can be set, in a sufficiently known manner, during the production method, for example by way of the thickness of the gate dielectric and/or the doping of a body region of said MOSFET.

Referring to FIG. 2, a further rectifier element can optionally be provided between the gate connection G of the power semiconductor component and that connection of the storage capacitor 50 which faces the drift control zone. In this embodiment, when the MOS transistor structure is first driven in the on state, that is to say when a gate-source voltage Vgs is first applied, the storage capacitor 50 is charged further if the gate-source voltage Vgs is greater than the capacitor voltage V50 established on account of the pinch-off voltage of the normally on transistor 31. The profile of the capacitor voltage V50 is illustrated in dash-dotted fashion for this case in FIG. 3. At the instant t1, the capacitor voltage V50 starts to rise further in this case until the capacitor voltage V50 reaches the value of the gate-source voltage Vgs. The drift control zone 21 is correspondingly charged to an electrical potential which corresponds to the gate-source voltage Vgs minus the voltage present across the load path D-S with the MOS transistor structure in the on state.

Figure 5:
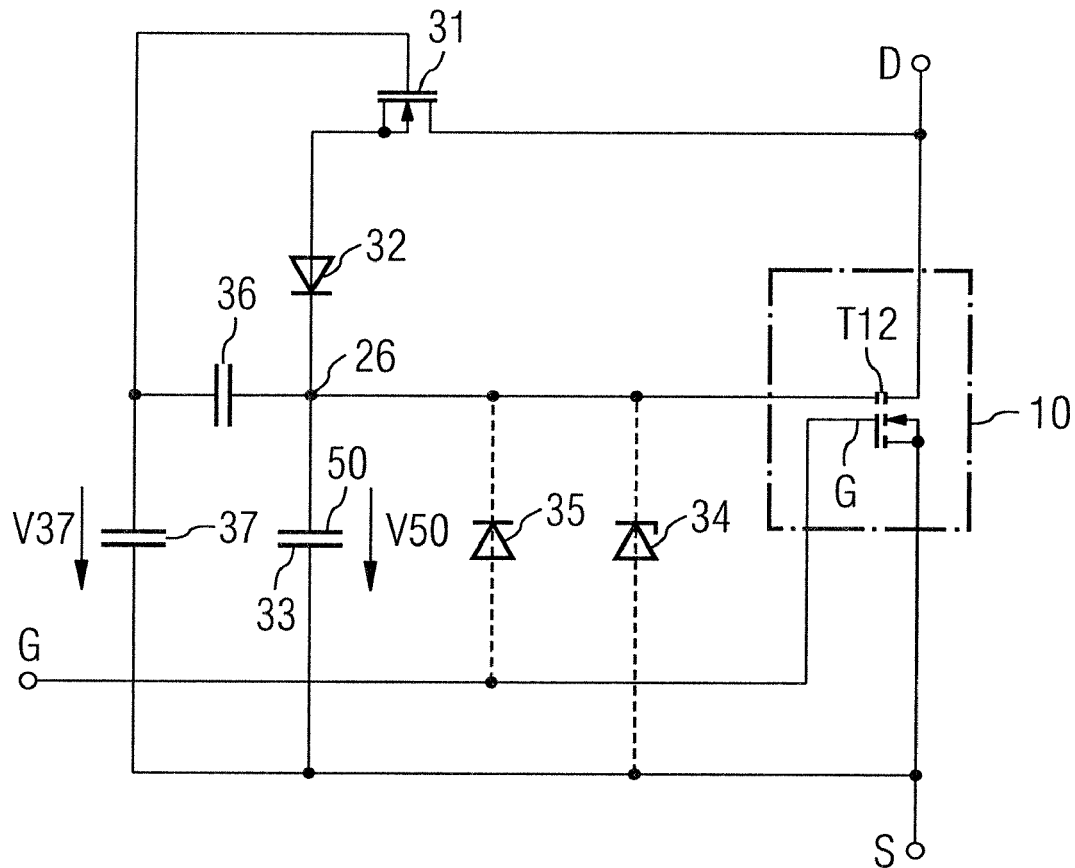
FIG. 5 illustrates one embodiment of a component arrangement on the basis of the electrical equivalent circuit diagram.
Figure 6A:
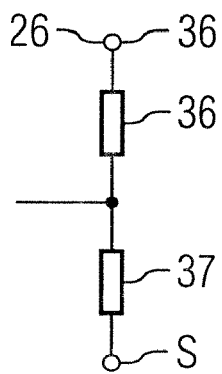
FIG. 6 illustrates alternatives for a capacitive voltage divider illustrated in FIG. 5.
Figure 6B:
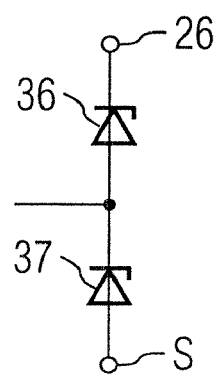
Figure 6C:
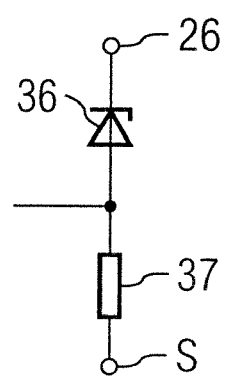

FIG. 5 illustrates one embodiment of a component arrangement on the basis of the electrical equivalent circuit diagram. As an alternative to the illustration in FIG. 2, the power semiconductor component in FIG. 5 is illustrated as a MOSFET T12 having two control electrodes, one of which represents the gate electrode and another of which represents the drift control zone. In the case of the component arrangement illustrated in FIG. 5, the driving of the normally on transistor 31 depending on the voltage V50 across the storage capacitor 50 is effected by a voltage divider 36, 37, which is connected in parallel with the storage capacitor 50 and which has a center tap connected to the control connection of the normally on transistor 31. In the example illustrated, the voltage divider 36, 37 is realized as a capacitive voltage divider having two capacitors 36, 37 connected in series. In one embodiment, said voltage divider can also be realized as a resistive voltage divider having high-resistance resistors, or as a voltage divider having zener diodes connected in series. A mixed realization of said voltage divider with at least one zener diode and at least one high-resistance nonreactive resistor is also possible. These alternatives mentioned are illustrated in FIGS. 6A to 6C.

In the case of the component arrangement illustrated in FIG. 5, a driving voltage of the normally on transistor 31 corresponds to a voltage V37 present at the center tap of the voltage divider. Said voltage V37 is related to the voltage across the storage capacitor V50 by way of the divider ratio of the voltage divider 36, 37. In this case, the voltage across the storage capacitor 50 that is set by the charging circuit 30 is dependent on the pinch-off voltage of the normally on transistor 31 and the divider ratio of the voltage divider 36, 37. In this embodiment, it is possible to use a normally on transistor 31 whose pinch-off voltage is lower than the desired storage voltage V50 of the storage capacitor 50.

The component arrangement having a power semiconductor component 10 with a drift zone 11 and a drift control zone 21, a capacitive storage arrangement 50 and a charging circuit 30 for the capacitive storage arrangement 50 is not restricted to a MOS transistor structure in accordance with FIG. 1, but rather can have any desired power semiconductor components with a drift zone and a drift control zone.

Thus, it is possible for example to provide a power transistor having a planar transistor structure in which the gate electrode—in contrast to the illustration in FIG. 1—is not arranged in a trench of the semiconductor body, but rather above the front side of the semiconductor body. In the case of such a planar transistor structure, an inversion channel in the body zone runs in a lateral direction of the semiconductor body. Such a structure will be explained below with reference to FIG. 9.

Furthermore, the drift zone 11 can be realized complementarily with respect to the drain zone 12, which is represented between parentheses in FIG. 1. In such a component, in the off-state case the space charge zone propagates proceeding from the pn junction between the drain zone 12 and the drift zone 11, whereby the gate dielectric 19 is reliably protected against high voltage loads in the off-state case. If the gate electrode 18 is realized in such a way that the inversion channel runs in a lateral direction of the semiconductor body at a distance from the accumulation channel along the drift control zone dielectric 29, in this variant it is necessary to provide a semiconductor zone 20 of the same conduction type as the drain zone 12 which extends in a lateral direction below the body zone 14 from the inversion channel along the gate dielectric 19 as far as the accumulation channel along the drift control zone dielectric 29.

Furthermore, there is the possibility of arranging the gate electrode 18 and the drift control zone 21 one above another in the vertical direction of the semiconductor body, which will be explained below with reference to FIG. 10.

In principle, the drift control zone 21 can be doped complementarily to the drain zone 12 or can be of the same conduction type as the drift zone 11. Furthermore, there is the possibility of realizing one or both of said zones 11, 21 as undoped or intrinsic semiconductor zones.

In a departure from the illustration in FIG. 1, the drift control zone 21 and the component zones that make contact with the drift control zone 21 can also be realized in different ways. By way of example, FIG. 7 illustrates a component arrangement in which a semiconductor zone 24 doped complementarily to the drift control zone 21 is arranged between the second connection contact 26 and the drift control zone 21, a more highly doped connection zone 25 optionally being present between said semiconductor zone 24 and the connection contact 26, said connection zone leading to a reduction of the contact resistance. The advantage of the component structure in FIG. 7 in comparison with the component structure in FIG. 1 is that here a pn junction is present which effects blocking as the potential rises in the drift control zone 22, such that an effect of the body zone 14, 15 is not necessary for the propagation of a space charge zone in the drift control zone 22. Furthermore, the p-zones 24, 15 with the body zone 14, 15 and the intervening section of the drift control zone 19 form a storage capacitance in which some of the charge carriers from the drift control zone 21 can be buffer-stored.

In the case of the component arrangement in accordance with FIG. 7, the diode 41 arranged between the drain zone 12 and the drift control zone 21 is integrated in the semiconductor body 100 and includes a semiconductor zone 411, which is adjacent to the drift control zone 21 and is doped complementarily thereto, and a more highly doped semiconductor zone 412, which is formed between the semiconductor zone 411 and the second connection electrode 23 and which provides for a low contact resistance. The first connection electrode 23 and the drain electrode 13 of the MOS transistor structure are realized as a common electrode layer in this embodiment. The drain zone 12 can optionally extend as far as below the drift control zone 22, in a manner not illustrated in greater detail. The more highly doped connection zone 412 is adjacent to the drain zone 12 in this case.

Instead of a bipolar diode between the drain zone 12 and the drift control zone 21, it is also possible to use a Schottky diode, in a manner not illustrated in greater detail. A further variant (not illustrated) provides for providing between the drain zone 12 and the drift control zone 21 a component structure with a tunnel dielectric which enables the potential of the drift control zone 21 to rise above the electrical potential of the drift zone 12.

FIG. 8 illustrates one embodiment of a component arrangement in which the power semiconductor component is embodied as a power diode with a drift zone 11, an anode zone 54 embodied complemetarily with respect to the drift zone 11, and a cathode zone 52 of the same conduction type as the drift zone 11. In this case, the drift control zone 21 is arranged adjacent to the drift zone 11 and in a manner dielectrically insulated from the drift zone 11. The functioning of the component arrangement illustrated in FIG. 8 when the diode is driven in the off state corresponds to the functioning of the component arrangement with a MOS transistor structure explained above. The power diode turns off when a positive voltage is applied between the cathode zone 52 or a cathode connection k, and the anode zone 54 or an anode connection A. The power diode is driven in the on state by applying a positive voltage between the anode zone 54 and the cathode zone 52. In this case, the functioning of the drift control zone for controlling an accumulation channel in the drift zone 11 along the drift control zone dielectric 29 corresponds to the functioning of the drift control zone explained above in connection with the MOS transistor structure.

The concept explained above can also be applied to Schottky diodes, in a manner not illustrated in greater detail. The structure of such a Schottky diode corresponds, in principle, to the structure of a bipolar diode, with the difference that a Schottky junction is present instead of a pn junction. Such a Schottky diode is obtained if, in the case of the bipolar diode illustrated in FIG. 8, the anode zone 54 is omitted and a suitable metal that forms a Schottky junction with the drift zone 11 is chosen for the electrode 56.

Figure 9:
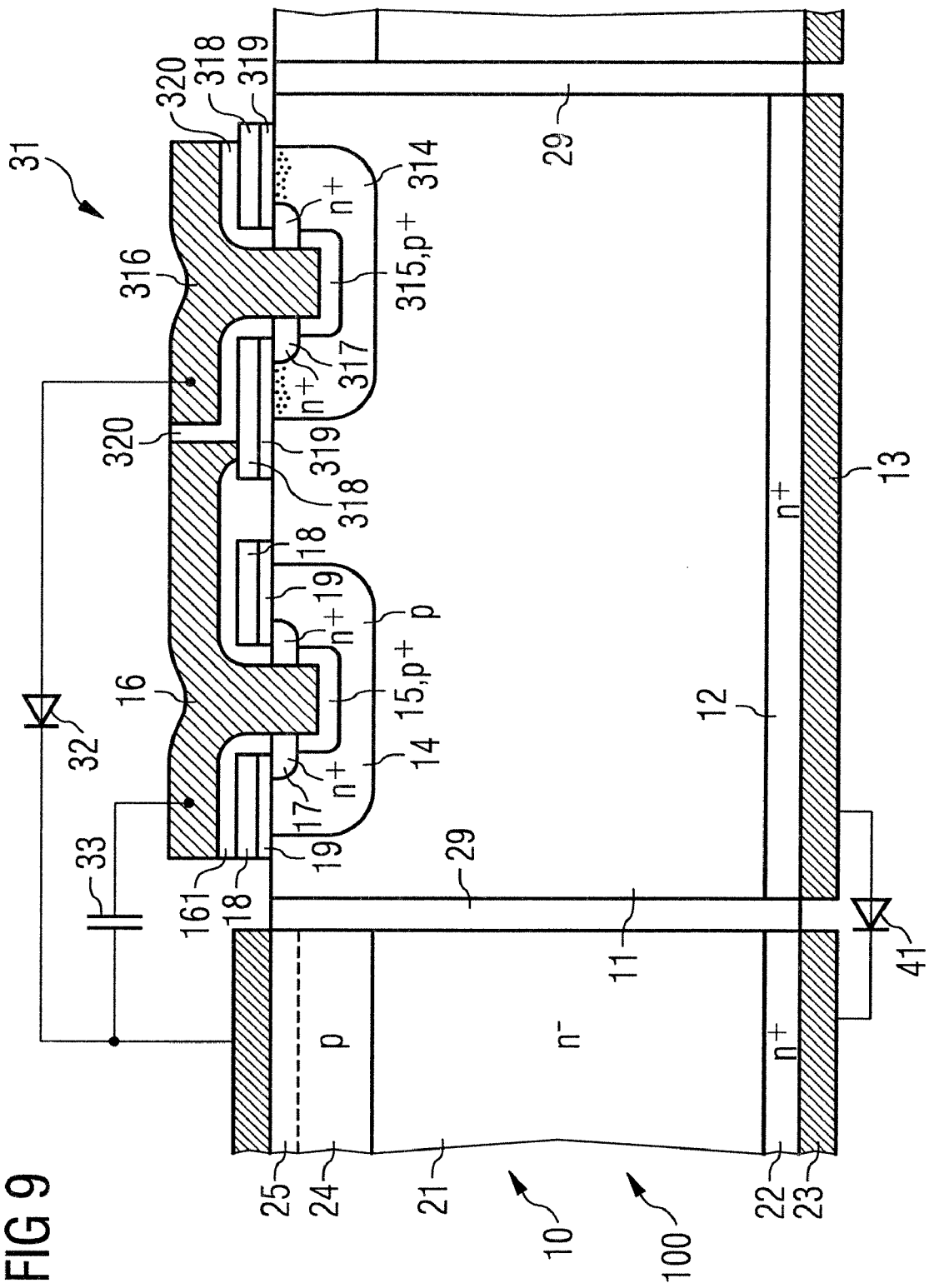
FIG. 9 illustrates one possible realization of a normally on transistor of the charging circuit in a semiconductor body of the power semiconductor component.

The capacitive charge storage arrangement 50 and also the components of the charging circuit 30 can be realized as external components, that is to say components arranged outside the semiconductor body 100, or can all or in part be integrated in the semiconductor body 100. FIG. 9 illustrates, for a component arrangement with a MOS transistor as power semiconductor component, one possibility for realizing the normally on transistor 31 of the charging circuit in the same semiconductor body 100 as the MOS transistor structure. In the example illustrated, the MOS transistor structure is realized as a planar transistor structure having a gate electrode 18 arranged above the front side 101 of the semiconductor body. In this case, the gate electrode 18 and the gate dielectric 19 arranged between the gate electrode 18 and the semiconductor body 100 have a cutout through which the source electrode 16 extends through the source zone 17 right into the body zone 14 and thereby makes contact with the source zone 17 and, via a highly doped connection zone 15, the body zone 14. In this case, the source electrode 16 is insulated from the gate electrode 18 by using an insulation layer 161. In the case of this planar transistor structure, the body zone 14 is realized in such a way that it surrounds the source zone 17 in horizontal and vertical directions of the semiconductor body. In this case, the drift zone 11 extends in sections as far as the front side 101 of the semiconductor body. When the gate electrode 18 is driven in a suitable manner, an inversion channel propagates in a lateral direction of the semiconductor body between the source zone 17 and a section of the drift zone 11 that extends as far as the front side 101, along the gate dielectric 19 in the body zone 14.

In the case of the component arrangement illustrated, the normally on transistor 9 likewise has a planar transistor structure with a gate electrode 318 arranged above the front side 101 and a gate dielectric 319 arranged between the gate electrode 318 and the semiconductor body. Said gate electrode 318 and the gate dielectric 319 have a cutout through which a source electrode 316 extends in a vertical direction into the semiconductor body 100, where it makes contact with a source zone 317 and a body zone 314 surrounding the source zone 317. In this case, a connection zone 315 doped more highly than the body zone 314 provides for a low-resistance connection of the source electrode 316 to the body zone 314. Contact is made with the gate electrode 318 of the normally on transistor 31 by the source electrode 16 of the transistor structure of the power semiconductor component 10.

In the example, the body zone 14 of the power transistor and the body zone 314 of the normally on transistor 31 are arranged jointly in the drift zone 11. The two transistor structures therefore have a common drift zone 11 and a common drain zone 12. In a manner that is not illustrated, however, they can also have separate drift zones, for example by a dielectric layer being arranged between the drift zones of these two components.

In a manner not illustrated in greater detail, there is also the possibility of arranging the body zone 314 of the normally on transistor 31 in the drift control zone 21. The normally on transistor then uses the drift control zone 21 as its drift zone, which is coupled to the drain connection 13 via the rectifier element 41.

Figure 10:
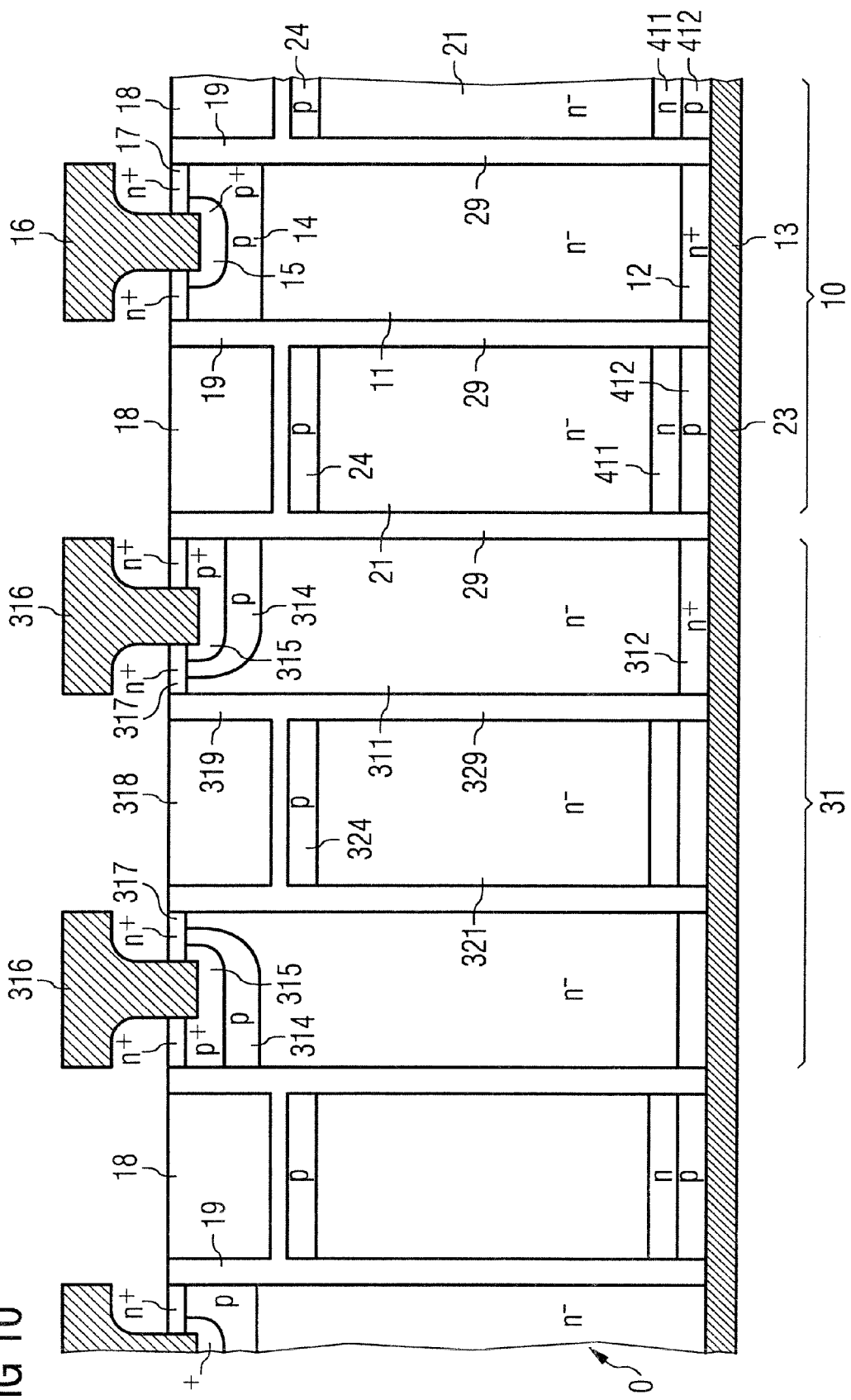
FIG. 10 illustrates a further possible realization of the normally on transistor of the charging circuit in the semiconductor body of the power semiconductor component.

A further possibility for the integration of the power semiconductor component 10 and the normally on transistor 31 in a common semiconductor body 100 is illustrated in FIG. 10. For reasons of clarity, FIG. 10 only illustrates a cross section through the semiconductor body 100. The remaining circuit components of the component arrangement are not illustrated.

In the case of the component arrangement illustrated, the power semiconductor component 10 includes a MOS transistor structure realized in accordance with the transistor structure explained with reference to FIG. 1, with the difference that the gate electrode 18 is arranged above the drift control zone 21 in the vertical direction of the semiconductor body 100. Consequently, in the case of this component arrangement, the drift control zone 21 only begins at the level of the drift zone 11 in the vertical direction of the semiconductor body. A dielectric layer is arranged between the gate electrode 18 and the drift control zone 21, which dielectric layer can correspond to the gate dielectric with regard to its thickness and its construction. In this embodiment, the gate dielectric 19 and the drift control zone dielectric 29 can include a common dielectric layer, for example composed of a semiconductor oxide.

In a manner not illustrated in greater detail, the drift control zone 21 can extend in sections as far as the front side 101 and be contact-connected there. Furthermore, there is the possibility of providing a connection electrode (not illustrated) which extends in sections through the gate electrode 18 right into the drift control zone 21 and makes contact with the drift control zone 21. In this case, said connection electrode is electrically insulated from the gate electrode 18.

In a lateral direction of the semiconductor body 100, a gate electrode 18 is adjacent on both sides of the body zone 14 and a drift control zone 21 is adjacent on both sides of the drift zone 11. In the example illustrated, the drain electrode 13 and the first connection electrode 23 of the drift control zone are realized as a common electrode layer. An integrated diode 411, 412 is arranged between the first connection electrode 23 and the drift control zone. The power semiconductor component 10 is constructed in cellular fashion and has a multiplicity of the transistor structures illustrated in FIG. 10, which are connected in parallel.

In the case of the component arrangement illustrated as an excerpt in FIG. 10, the semiconductor body 100 is subdivided in a lateral direction into a number of active component sections and driving sections which are in each case arranged alternately and between which a respective dielectric layer 29, 329 is arranged. Some of the component sections respectively include sections of the source zone 15, of the body zone 14, of the drift zone 11 and of the drain zone 12 of the MOS transistor structure of the power semiconductor component. Control zone sections of the power semiconductor component are respectively arranged adjacent to said component sections of the power semiconductor component 10, and sections of the gate electrode 18 and of the drift control zone 21 of the power semiconductor component 10 are respectively arranged in said control zone sections.

Transistor structures of the normally on transistor 31 are realized in other active component sections of the semiconductor body 100. Each of the transistor structures of the normally on transistor includes a drain zone 312, a drift zone 311, a body zone 314 and a source zone 317 lying one above another in the vertical direction. A source electrode 316 extends in the vertical direction of the semiconductor body 100 through the source zone 317 right into the body zone 314, a highly doped connection zone 315 ensuring a low-resistance contact between the source electrode 316 and the body zone 314. The gate electrode 318 of the normally on transistor 31 is arranged in a control zone section adjacent to the active component section. The drift zone 311 of the normally on transistor 31 extends adjacent to the gate electrode 318 as far as the source zone 317, whereby a conducting channel is permanently present between the source zone 317 and the drain zone 312 when the gate electrode 318 is not driven, which channel can be pinched off and the gate electrode 318 is driven in a suitable manner.

In the example illustrated, two active component sections containing active component zones of the normally on transistor 31 are respectively arranged adjacent to a control zone section containing the gate electrode 318 of the normally on transistor. The active component sections of the normally on transistor 31 are adjacent to control zone sections of the power semiconductor component 10 on the side remote from the gate electrode 318. In order to prevent a conducting channel in the active component sections of the normally on transistor 31 from being controlled by the gate electrode 18 of the power semiconductor component, the highly doped connection zone 315 of the normally on transistor extends in a lateral direction as far as a dielectric layer 319 between the control zone section of the power semiconductor 10 and the active component section of the normally on transistor 31. Said connection zone 315 is doped so highly that the gate electrode 18 of the power semiconductor component cannot bring about a conducting channel between the source zone 317 and the drift zone 311 of the normally on transistor 31.

The production of the component structure illustrated in FIG. 10 involves firstly producing a semiconductor body 100 with active component sections and control zone sections arranged alternately, the individual component sections initially being identical and only having the diode structure in the region of a rear side 102 of the semiconductor body and the sections corresponding to the later drift zones. In a corresponding manner, the control zone sections are each constructed identically and have the gate electrodes and the drift control zone sections required for the power semiconductor component. By using sufficiently known implantation and diffusion processes, the source and body zones are then produced in the active component sections, source and body zones being produced either for the power semiconductor component 10 or for the normally on transistor 32 by using a suitable choice of the implantation and diffusion processes. Sections below the gate electrode 318 of the normally on transistor which form the drift control zone in the region of the power semiconductor component 10 and which are designated by the reference symbols 321 and 324 in FIG. 10 can remain unused in this case, such that no accumulation channel is controlled within the drift zone 311 of the normally on transistor.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A component arrangement comprising:
    a power semiconductor component comprising:
        a drift zone, arranged between a first and a second component zone;
        a drift control zone, arranged adjacent to the drift zone and dielectrically insulated from the drift zone by a dielectric layer,
        a capacitive storage arrangement coupled to the drift control zone; and
        a charging circuit coupled between the first component zone and the capacitive storage arrangement, the charging circuit comprising a rectifier element.

2. The component arrangement of claim 1, comprising wherein the charging circuit is connected between the first component zone and a connection of the capacitive storage arrangement which faces the drift control zone.

3. The component arrangement of claim 1, comprising wherein the charging circuit has a normally on transistor having a load path and a control connection, the load path is connected between the first component zone and the capacitive storage arrangement and driven depending on a voltage present across the capacitive storage arrangement.

4. The component arrangement of claim 3, comprising wherein the control connection of the normally on transistor is coupled to a connection of the capacitive storage arrangement remote from the drift control zone.

5. The component arrangement of claim 4, comprising wherein the control connection of the normally on transistor is connected via a voltage divider to that connection of the capacitive storage arrangement remote from the drift control zone.

6. The component arrangement of claim 1, in which a voltage limiting element is connected in parallel with the capacitive storage arrangement.

7. The component arrangement of claim 1, comprising wherein the power semiconductor component is a diode, wherein the first component zone and the second component zone respectively form one of anode and cathode zones.

8. The component arrangement of claim 7, comprising wherein the drift control zone is connected to the second component zone at a side remote from the capacitive storage arrangement.

9. The component arrangement of claim 8, comprising wherein a component rectifier element is connected between the drift control zone and the first component zone.

10. The component arrangement of claim 1, comprising wherein the drift control zone is composed of a monocrystalline semiconductor material.

11. A component arrangement including a MOS transistor power semiconductor component comprising:
    a drift zone, arranged between a first and a second component zone;
    a drift control zone, arranged adjacent to the drift zone and dielectrically insulated from the drift zone by a dielectric layer;
    a capacitive storage arrangement coupled to the drift control zone;
    a charging circuit coupled between the first component zone and the capacitive storage arrangement,
    wherein the first component zone forms a drain zone and the second component zone forms a body zone, and
    a source zone of a conduction type complementary to the conduction type of the body zone, the source zone being adjacent to the body zone at a side remote from the drift zone; and
    a gate electrode, which is arranged adjacent to the body zone and which is dielectrically insulated from the body zone.

12. The component arrangement of claim 11, comprising wherein the drain zone, the drift zone and the source zone are of a same conduction type.

13. The component arrangement of claim 11, comprising wherein the drain zone is of the same conduction type as the source zone and the drift zone is of a conduction type complementary to the conduction type of the drain zone and the source zone.

14. The component arrangement of claim 11, comprising wherein a rectifier element is connected between the gate electrode and the capacitive storage arrangement.

15. A component arrangement including a power semiconductor component comprising:

a drift zone, arranged between a first and a second component zone;

a drift control zone, arranged adjacent to the drift zone and dielectrically insulated from the drift zone by a dielectric layer;

a capacitive storage arrangement coupled to the drift control zone; and a charging circuit coupled between the first component zone and the capacitive storage arrangement, the charging circuit including a normally on transistor and a rectifier element, wherein the normally on transistor is integrated in the same semiconductor body as the power semiconductor component.

16. The component arrangement of claim 15, comprising wherein the power semiconductor component and the normally on transistor have a common drift zone.

17. The component arrangement of claim 15, comprising wherein the normally on transistor has a body zone arranged in the drift control zone.

18. The component arrangement of claim 17, comprising wherein a doping concentration of the drift control zone corresponds, at least in sections, at least approximately to a doping concentration of the drift zone.

19. The component arrangement of claim 15, comprising wherein the normally on transistor has a drift zone separated from the drift zone of the power semiconductor component and from the drift control zone of the power semiconductor component.

20. A method of making a semiconductor component comprising:

arranging a drift zone between a first and a second component zone;

arranging a drift control zone adjacent to the drift zone and dielectrically insulated from the drift zone by a dielectric layer;

coupling a capacitive storage arrangement to the drift control zone; and coupling a charging circuit between the first component zone and the capacitive storage arrangement.

21. The method of claim 20, comprising:

defining the charging circuit to include a normally on transistor having a load path and a control connection, the load path coupled between the first component zone and the capacitive storage arrangement and driven depending on a voltage present across the capacitive storage arrangement.

22. A component arrangement comprising:

a power semiconductor component comprising:

a drift zone, arranged between a first and a second component zone;

a drift control zone, arranged adjacent to the drift zone and dielectrically insulated from the drift zone by a dielectric layer;

means for providing a capacitive storage arrangement coupled to the drift control zone; and means for providing a charging circuit coupled between the first component zone and the capacitive storage arrangement.

\* \* \* \* \*